(12) United States Patent
Muurinen (10) Patent No.: US 6,504,492 B1
(45) Date of Patent: Jan. 7, 2003

(54) INPUT MEANS FOR GENERATING INPUT SIGNALS TO AN ELECTRONIC DEVICE

(75) Inventor: Jari Muurinen, Perniö (FI)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/453,648

(22) Filed: Dec. 3, 1999

(30) Foreign Application Priority Data

Apr. 12, 1998 (FI) .................................................. 982618

(51) Int. Cl.⁷ .............................................. H03K 17/94
(52) U.S. Cl. ......................... 341/22; 341/34; 200/512
(58) Field of Search .................. 341/22, 34; 178/18.05; 200/5 A, 5 R, 512; 345/173, 174

(56) References Cited

U.S. PATENT DOCUMENTS

| | | | |
|---|---|---|---|
| 4,484,029 A | | 11/1984 | Thornburg .................... 178/18 |
| RE32,419 E | * | 5/1987 | Ronney ....................... 200/5 R |
| 4,725,817 A | * | 2/1988 | Wihlborg ...................... 341/34 |
| 4,755,634 A | * | 7/1988 | Pepper, Jr. ............... 178/18.01 |
| 5,181,030 A | * | 1/1993 | Itaya et al. .............. 178/18.06 |

FOREIGN PATENT DOCUMENTS

| | | |
|---|---|---|
| EP | 0136630 A2 | 4/1985 |
| EP | 0695041 | 1/1996 |
| GB | 2151379 A | 7/1985 |
| WO | WO 92/14345 | 8/1992 |

OTHER PUBLICATIONS

"Simplifying Membrane Switch Interfacing", Schiff, Machine Design, pp 124 and 126, 1988.

* cited by examiner

Primary Examiner—Timothy Edwards, Jr.
(74) Attorney, Agent, or Firm—Perman & Green, LLP (57) ABSTRACT

A keypad arrangement is used for providing electrical information to an electronic device in response to a manual pressing action of a user. The keypad arrangement comprises a number of depressable keys (803, 907) within a certain keypad area. It comprises also an arrangement of essentially continuous conducting means (301, 302, 901, 902, 1401, 1402) next to the depressable keys. Connection creating means (801, 908) are associated with each depressable key for providing, as a response to the depression of a key, an electrical connection through said essentially continuous conducting means. The electrical characteristics of the created electrical connection uniquely identify the location of the depressed key in relation to said essentially continuous conducting means.

18 Claims, 7 Drawing Sheets

INPUT MEANS FOR GENERATING INPUT
SIGNALS TO AN ELECTRONIC DEVICE

TECHNOLOGICAL FIELD

The invention concerns generally the technology of generating an input signal to an electronic device in response to a manual operation of a user. Especially the invention concerns a structure that allows a device manufacturer to freely design the outlook of a keyboard or the like.

BACKGROUND OF THE INVENTION

Figure 1:
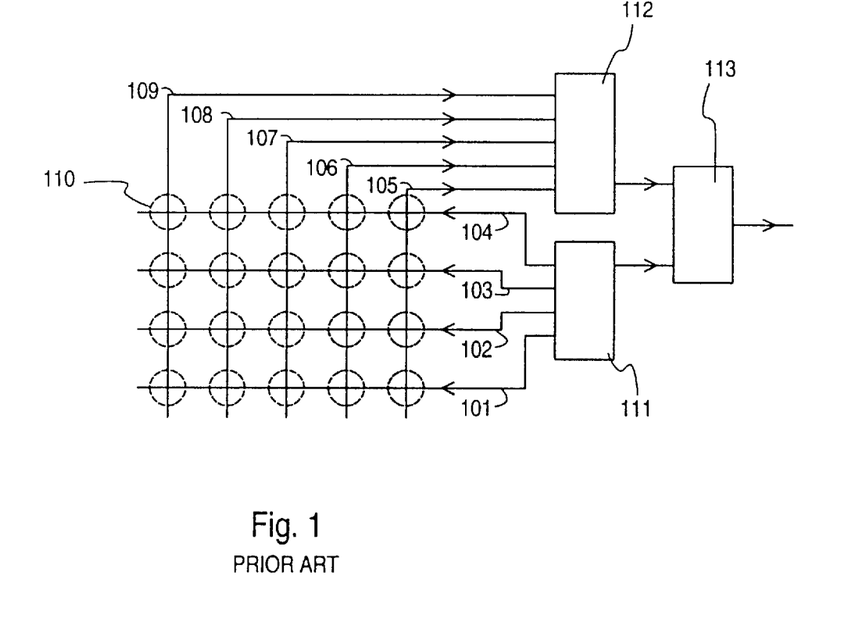
FIG. 1 illustrates a previously known keypad structure.

Keyboards or -pads are conventionally used for converting a manual action of a human user to an input signal comprehensible to a digital signal processing device. FIG. 1 illustrates a known rectangular keypad that consists of N×M keys; here N=4 and M=5. The arrangement comprises N conductive input rows 101 to 104 and M conductive output columns 105 to 109 where normally the rows and columns do not have a galvanic contact with each other. At each junction of a row and a column there is a key, comprising a conductive dome shown as a dotted circle and supported over the junction so that normally it does not contact the intersecting conductors. Pressing for example the key shown as 110 will cause the conductive dome to produce a galvanic contact between row 104 and column 109. An input voltage distributor 111 energises each of the input rows in cyclical turns at a rate that is expected to exceed the rate of pressing the keys by the user. An output detector 112 detects the energisation caused in one of the output lines when the energisation of the corresponding input line coincides with a conductive dome coupling the input and output lines at one intersection. The logical encoding block 113 converts the observation of a keystroke to a bit sequence that unequivocally indicates, which key was pressed.

The drawbacks of the arrangement of FIG. 1 comprise the relatively high power dissipation of the N parallel voltage buffers included in block 111 that are required to maintain the continuous sequential energisation of the input rows, as well as the electromagnetic interference which the rapid cyclical energisation of the rows tends to cause to any nearby sensitive electronic devices.

Figure 2:
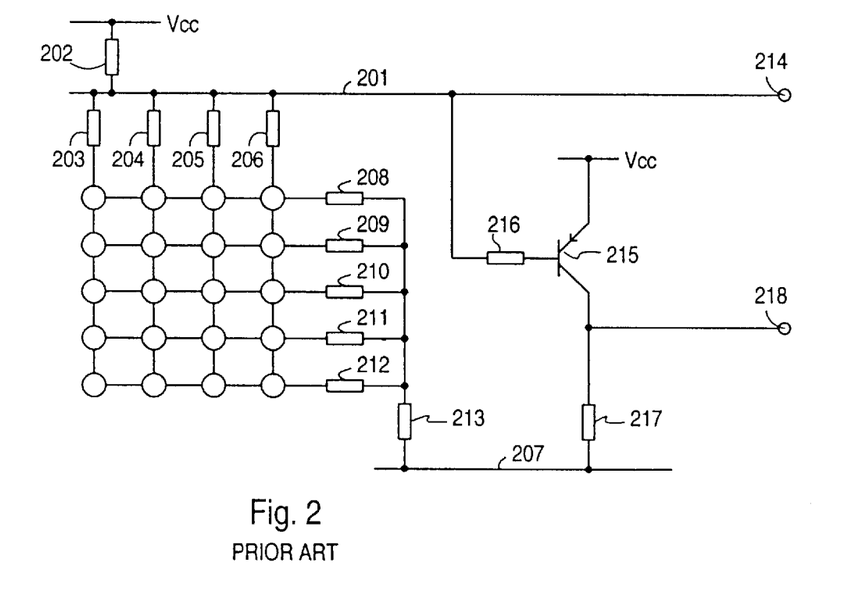
FIG. 2 illustrates another previously known keypad structure.

From the European patent publication number EP 695 041, which is incorporated herein by reference, there is known a keypad arrangement according to FIG. 2. A supply voltage Vcc is provided to a positive voltage rail 201 through a resistor 202. From the positive voltage rail there is a connection to each column of keys through a resistor 203–206 so that each of the resistors has a different value. Each row of keys is coupled to a ground rail 207 so that from each row there is a connection to a common connection point through a differently valued resistor 208–212, and from the common connection point there is a connection to the ground rail through a resistor 213. The positive voltage rail 201 is coupled to a first output port 214. The circuit comprises also a PNP transistor 215 the emitter of which is coupled to the supply voltage Vcc, the base of which is coupled to the positive voltage rail 201 through a resistor 216 and the collector of which is coupled to the ground rail 207 through a resistor 217. The collector of the PNP transistor 214 is also coupled to a second output port 218.

The idea of the keypad according to FIG. 2 is that when a certain key is pressed, a resistive current path is produced between the positive voltage rail and the ground rail. The resistance value of the current path is unambiguously associated to the depressed key, because all the column resistors 203–206 and row resistors 208–212 have different values. The variable resistance of the current path acts as a part of a voltage divider together with the resistor 202, which in turn causes the positive voltage rail to assume a voltage value that is also unambiguously associated to the key which was pressed. An A/D converter (not shown) connected to the first output port converts the voltage value of the positive voltage rail into a digital word representing the depressed key. The circuit built around the PNP transistor will generate an interrupt signal that is readable from the second output port and indicates when a key is pressed.

The keypad of FIG. 2 is much more advantageous than that of FIG. 1 in numerous ways: for example, it causes much less electromagnetic interference and dissipates much less power during operation. However, there are still certain drawbacks. A manufacturer of electronic devices will often want to put a series of slightly different models on the market. In many cases it is most advantageous to keep the inner structures the same from one model to another to as large an extent as possible, and use visible design features to distinguish the models from each other. If the different models have differently located keys in the keypad, or a different number number of keys, the resistor networks and the the printed circuit board that acts as the support structure of the keypad must all be specific to each model. It would be very advantageous if the arrangement of keys could be variable without modifications to the inner structures of the keypad.

SUMMARY OF THE INVENTION

It is therefore an object of the present invention to provide a keypad structure that allows for the location and number of keys to be varied without essential modifications to the inner structyres of the keypad. It is also an object of the invention to provide a keypad that is easily adapted to mass production. A further object of the invention is to provide a keypad with a simple and reliable structure.

The objects of the invention are achieved by building the keypad on top of certain essentially continuous conducting means for providing a very large number of unambiguously identifiable current paths as a response to depressions at various locations on the keypad.

The keypad according to the invention is characterised in that it comprises an arrangement of essentially continuous conducting means next to the depressable keys and     connection creating means associated with each depressable key for providing, as a response to the depression of a key, an electrical connection through said essentially continuous conducting means so that the electrical characteristics of the created electrical connection uniquely identify the location of the depressed key in relation to said essentially continuous conducting means.

The invention applies also to an electronic device with a keypad, an analogue to digital converter and some digital circuitry. It is characteristic to the electronic device that     the keypad comprises an arrangement of essentially continuous conducting means next to the depressable keys and connection creating means associated with each depressable key for providing, as a response to the depression of a key, an electrical connection through said essentially continuous conducting means so that the electrical characteristics of the created electrical connection uniquely identify the location of the depressed key in relation to said essentially continuous conducting means, and the analogue to digital converter is arranged to identify the electrical characteristics of the created electrical connection and to provide digital information that uniquely identifies the depressed key to the digital circuitry.

According to the invention the keypad structure comprises, under the part(s) that consitutes the actual keys, an arrangement of essentially continuous conductive means over a certain area. The conductive means are arranged so that in an idle state (no keys being pressed) there are essentially no current paths through them. The depression of a key creates a temporary current path through the continuous conductive means at a certain location. The electrical characteristics associated with such a temporarily created current path are unique to (fiat location. By sensing the electrical characteristics of the created current path it is possible to identify the location where a key was depressed.

The essential difference between the invention and most prior art keypad structures is that the arrangement of essentially continuous conductive means is equally responsive to depressions at a very large number of locations, whereas the prior art keypad structures have involved a discrete and relatively small number of intersections between columns and lines where the creation of a current path has been possible. The invention enables the designer of the keyboard to place an almost arbitrary number of keys into arbitrary locations. The most important factor that limits the number of keys by setting a minimum distance requirement between adjacent keys is the sensitivity of the sensing means that are used to sense the electrical characteristics of the created current path. In many cases an important limiting factor is also the physical size of the keys; if the keys are meant to be operable by fingers, they should not be so small and so close to each other that an adequate user would find it difficult not to depress two adjacent keys simultaneously.

An advantageous form for the arrangement of essentially continuous conductive means is a meandering pair of elongated resistive strips that cover the whole area over which the keys can be located. Each key will then be associated with a conductive dome that in the idle state does not touch the resistive strips. The depression of a key will cause the respective conductive dome to press against the resistive strips creating a conductive bridge between the strips. By measuring the resistance of the current path that consists of the parts of the resistive strips up to the connection point it is possible to determine, how far from the beginning of the resistive strips was the depression point.

Another advantageous form for the arrangement of essentially continuous conductive means is a pair of conductive planes situated in parallal to each other but not touching each other in the idle state. A depression of a key will create a local conductive contact between the planes at a certain location. By using an arrangement of input and output electrodes along the sides of the planes it is possible to determine the electrical characteristics of a current path that runs through the connection point. From the measured electrical characteristics it is possible to calculate the position of the connection point.

It is possible to integrate into the keypad arrangement according to the invention a circuit for generating an interrupt signal at the depression of a key. Such circuits are well known in the art from e.g. the previously mentioned European patent publication number EP 695 041.

BRIEF DESCRIPTION OF DRAWINGS

The novel features which are considered as characteristic of the invention are set forth in particular in the appended Claims. The invention itself, however, both as to its construction and its method of operation, together with additional objects and advantages thereof, will be best understood from the following description of specific embodiments when read in connection with the accompanying drawings.

FIG. 6b is an equivalent circuit diagram to FIG. 6a, FIG. 7a illustrates a keypad application based on one of the the principles of FIGS. 3a, 4a, ; 5a or 6a, FIG. 7b illustrates an advantageous detail of FIG. 7a, FIGS. 8a and 8b illustrate a key in a keypad application.

FIGS. 1 and 2 were discussed previously within the description of prior art, so in the following we will consider mainly FIGS. 3a to 15. Like parts in the drawings are designated with identical reference designators.

DETAILED DESCRIPTION OF THE INVENTION

In the following, we will use the attribute "resistive" for such electrically conducting means that have a certain significant resistance which has an important role to the operation of the invention. All those electrically conducting means that have a relatively small resistance the value of which is not important to the invention will be designated as "conductive". The resistance of the parts of the latter kind is typically in the order of that of copper, gold or another well-conducting metal.

Figure 3A:
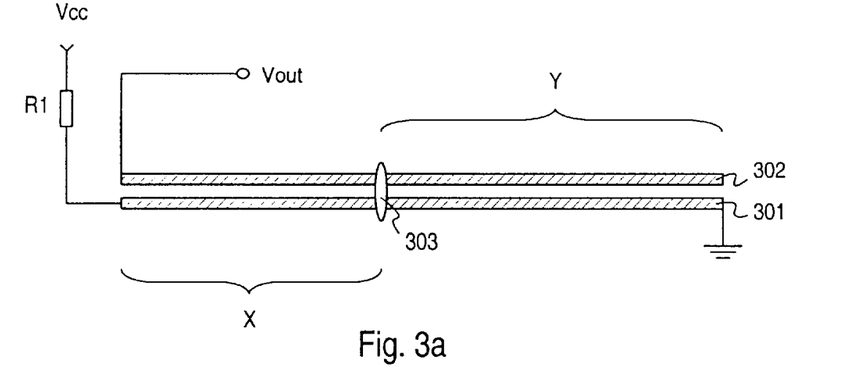
FIG. 3a illustrates a measurement concept according to a first advantageous embodiment of the invention.

FIG. 3a is a conceptual representation of an arrangement for producing unequivocal digital input information in response of manual user actions. The arrangement comprises a first resistive strip 301 and a second resistive strip 302 in a parallel, non-touching set-up. We may designate the specific resistance of the first resistive strip 301 as $r_1$ ohms per unit length and the specific resistance of the second resistive strip 302 as $r_2$ ohms per unit length. The values $r_1$ and $r_2$ may or may not be the same, but each resistive strip is assumed to have a constant specific resistance throughout its length. At point 303 there is a conductive connection between the resistive strips, caused by for example a conductive dome being pressed simultaneously against the surfaces of both resistive strips. The distance between the connection point 303 and the first ends of the resistive strips is X length units and the distance between the connection point 303 and the second ends of the resistive strips is Y length units.

The first end (the left-hand end in FIG. 3a) of the first resistive strip 301 is coupled to a supply voltage Vcc through a resistor R1 and the second end of the resistive strip 301 is coupled to a fixed potential, which in this example is the ground potential. Correspondingly the first end of the second resistive strip 302 is coupled to an output port for an output voltage Vout to be measurable and the second end of the second resistive strip 302 is not coupled to anywhere. The connections shown by single lines in FIG. 3a are assumed to have a negligible resistance.

Figure 3B:
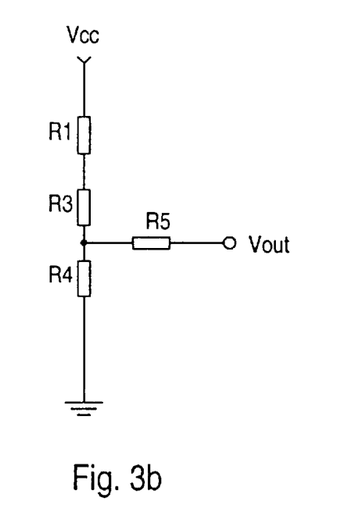
FIG. 3b is an equivalent circuit diagram to FIG. 3a, FIG. 4a illustrates another measurement concept.

When we know the specific resistances of the resistive strips 301 and 302 and the distances X and Y, it is possible to draw the equivalent circuit diagram of FIG. 3b and calculate the resistance values of the equivalent resistors R3, R4 and R5. These values are $$R3 = X \cdot r_1, \quad R4 = Y \cdot r_1, \quad R5 = X \cdot r_2 \qquad (1)$$

By assuming that the output port where the output voltage Vout is measured sinks only a negligible current, and by applying the elementary formulae of voltage division it is possible to write the following expression for the output voltage Vout:

$$Vout = \frac{R4}{R1 + R3 + R4} Vcc = \frac{Yr_1}{R1 + r_1(X+Y)} Vcc = \frac{Yr_1}{R1 + R_A} Vcc \qquad (2)$$

where $R_A$ is the total resistance of the first resistive strip 301. It is apparent from the last form of the expression (2) that the voltage Vout depends only on the position of the conductive connection 303 in relation to the ends of the first resistive strip, as well as on the specific resistance of the strip. Taking into account the current drawn by the output port would slightly modify the expression (2), introduce into it a dependency on the specific resistance of the second resistive strip 302 and lower the value of the voltage Vcc; such a more detailed theoretical analysis is well within the capabilities of the person skilled in the art so we will not elaborate on it here.

The dependency on the specific resistance should not be understood in such a way that the measurement concept of FIG. 3a would require the specific resistance to have a certain value. Basically the arrangement functions equally well with any value of the specific resistance, as long as it is essentially constant along the length of the resistive strip.

Figure 4A:
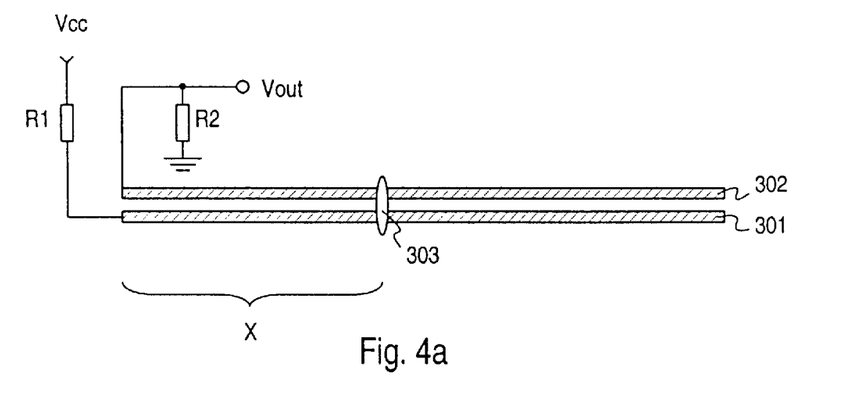

FIGS. 4a to 6b present some alternatives to the arrangement of FIG. 3a as well as the respective equivalent circuit diagrams. In FIG. 4a there is no connection to the fixed (ground) potential from the distant end of the first resistive strip, but there is a connection to a fixed (ground) potential from the first end of the second resistive strip 302 through a resistor R2. The output port is coupled in between the second resistive strip and the resistor R2. The corresponding equivalent circuit diagram is seen in FIG. 4b, and the expression for the measured voltage Vout is $$Vout = \frac{R2}{R1 + R2 + R3 + R5} Vcc = \frac{R2}{R1 + R2 + X(r_1 + r_2)} Vcc \qquad (3)$$

Figure 4B:
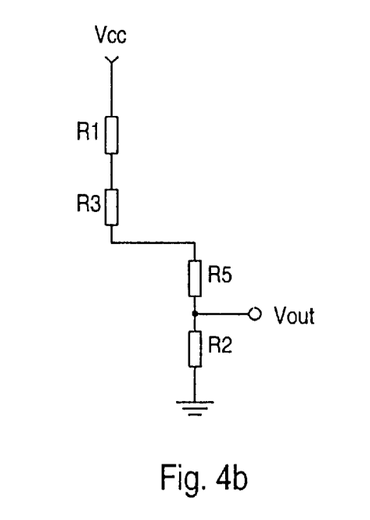
FIG. 4b is an equivalent circuit diagram to FIG. 4a, FIG. 5a illustrates another measurement concept.

Again we have assumed that the measurement of the voltage Vout does not sink any current. An interesting embodiment according to the principle of FIGS. 4a and 4b is such where one of the resistive strips is not actually resistive but a relatively good conductor with a very small specific resistance. This would allow in the last form of (3) the simplification $(r_1+r_2) \approx r_1$ or $(r_1+r_2) \approx r_2$, depending on which one of the specific resistances is negligibly small—the other specific resistance is called then the remaining specific resistance. The value of Vout would thereby depend only on X and on the remaining specific resistance. An important feature of the embodiment of FIG. 4a is also seen by comparing the expressions (2) and (3): in FIG. 4a the value of Vout does not depend at all on the total length of the resistive strips.

Figure 5A:
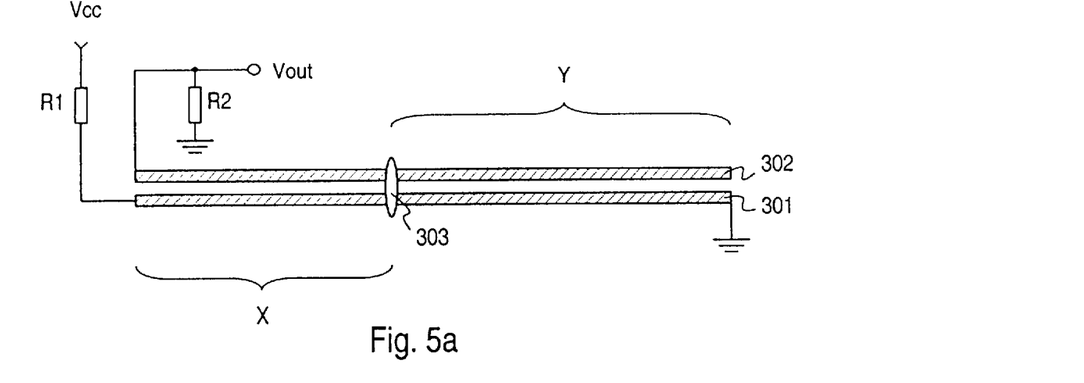
Figure 5B:
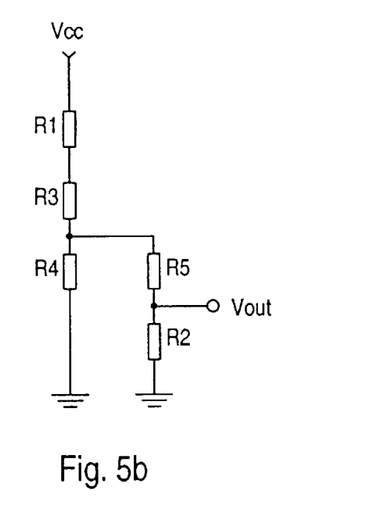
FIG. 5b is an equivalent circuit diagram to FIG. 5a, FIG. 6a illustrates another measurement concept.

FIG. 5a illustrates a combination of the principles of FIGS. 3a and 4a. There is a connection to a fixed (ground) potential at the distant end of the first resistive strip and a resistor R2 between the first end of the second resistive strip and the fixed (ground) potential. The equivalent circuit diagram is seen in FIG. 5b and the expression for the voltage Vout has the slightly more complicated form $$Vout = \frac{R4(R2 + R5)}{(R2 + R4 + R5)(R1 + R3) + R4(R2 + R5)} Vcc \qquad (4)$$

which contains dependencies on both the specific resistances and as well as on the lengths X and Y—to more clearly see the dependencies one should make the replacements indicated by the formulae (1).

Figure 6A:
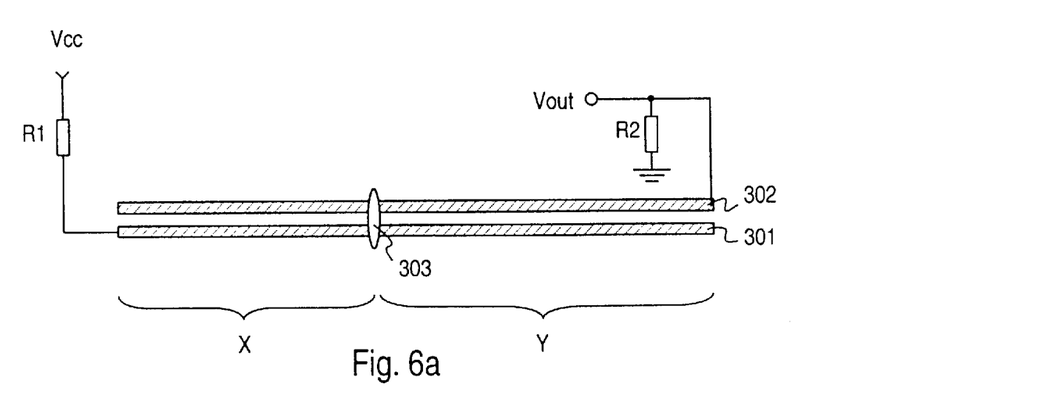
Figure 6B:
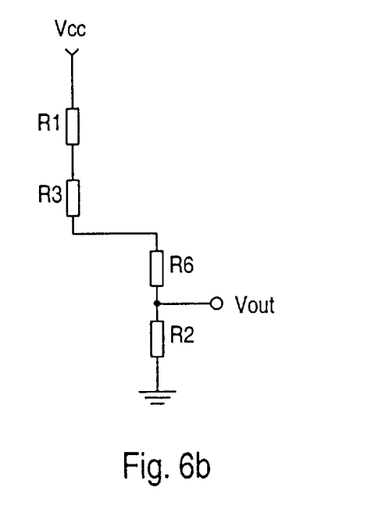

FIG. 6a illustrates yet another principle which is actually a variation of that in FIG. 4a. Here the connection to the fixed (ground) potential through resistor R2 is from the distant end of the second resistive strip, with the output port associated therein. The equivalent circuit diagram is seen in FIG. 6b, where the resistor R6 has the value $R6 = Y \cdot r_2$. The expression of the output voltage Vout is $$Vout = \frac{R2}{R1 + R2 + R3 + R6} Vcc = \frac{R2}{R1 + R2 + Xr_1 + Yr_2} Vcc \qquad (5)$$

where again one of the dependencies on length and specific resistance ($Xr_1$ or $Yr_2$) may be made negligible by replacing the corresponding resistive strip with a good conductor. Such a replacement would also have the important effect of removing from the expression the dependency on the total length (X+Y) of the parallel resistive strip arrangement.

Figure 7A:
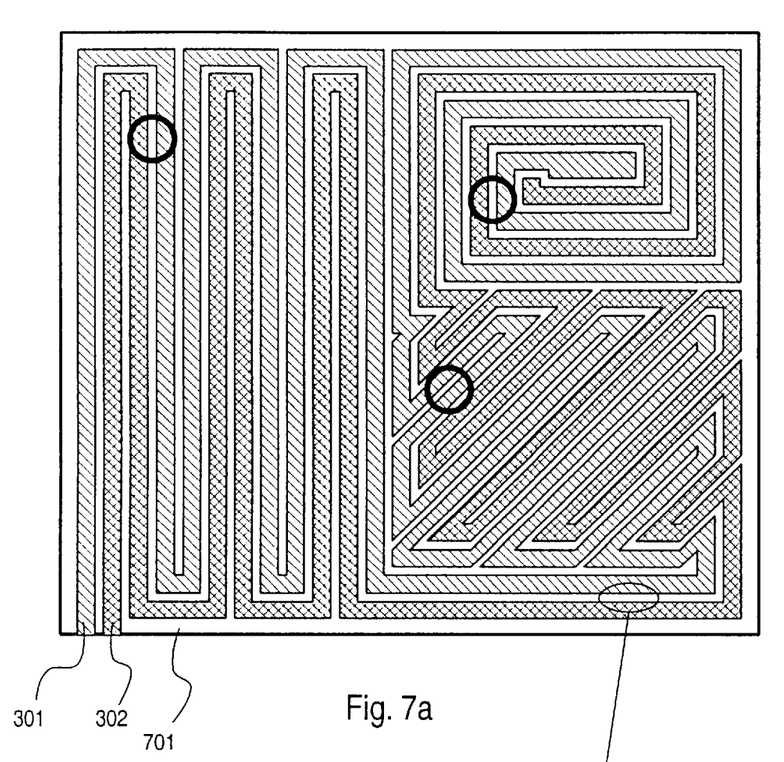

FIG. 7a illustrates schematically a keypad application which is based on the principle of parallel resistive strips. It should be noted that the measurement of the output voltage according to the embodiments explained above is in no way sensitive to the resistive strips being straight, as long as they have a well-defined length in certain direction. The keypad application of FIG. 7a comprises a dielectric board 701 an on its surface a meandering pair of resistive strips 301 and 302. Some exemplary forms of meandering are shown in FIG. 7a: directly across the whole available surface in one direction as in the left-hand portion of the dielectric board 701, diagonally over the surface of a rectangular area as in the lower right-hand portion of the dielectric board 701 and spirally towards a center as in the upper right-hand portion of the dielectric board 701. Other possible ways of implementing the meandering are easily put forward by persons skilled in the art by applying the teachings given herein. For example curvilinear meandering may be advantageous in some applications. The invention does not limit the type or number of different types of meandering that are used for a single keypad application.

Figure 7B:
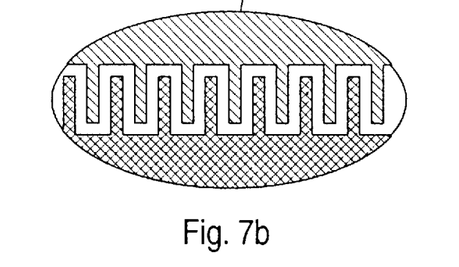

The meandering may even take place in two or several orders. This means that in addition to the "macroscopic" meandering shown in FIG. 7a, the adjacent edges of the resistive strips may contain a large number of small finger-like projections that intertwine with each other like in the partial enlargement of FIG. 7b. The dimensions of the small finger-like projections are so small that they may be neglected in defining the length of the resistive strip in terms of calculating the output voltage Vout.

A keypad designer who has a dielectric circuit board according to FIG. 7a at his disposal may place an almost arbitrary number of keys over the available surface.

Figure 8A:
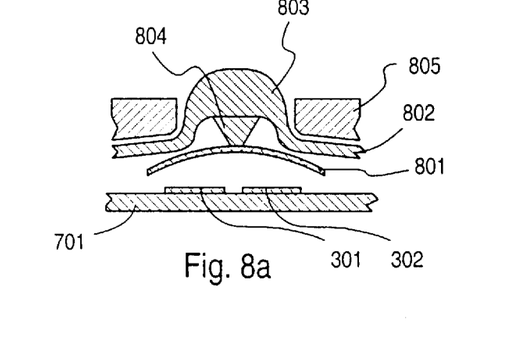
Figure 8B:
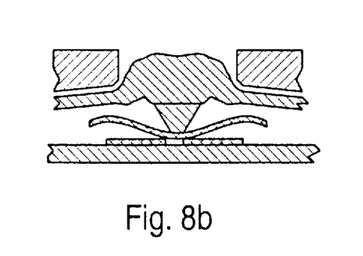

Three possible locations for a key are shown in FIG. 7a as dark circles. A key is supposed to comprise an elastically deformable conductive dome known as such or similar means that produces, as a response to pressing, an electrically conductive connection between certain points on the surface that lies directly under it. The function of one such key in connection with the dielectric board of FIG. 7a is shown schematically in the cross-sections of FIGS. 8a and 8b. The arrangement comprises a dielectric board 701, a pair of resistive strips 301 and 302 on its one surface and an elastically deformable conductive dome 801 placed at a relatively short distance above said surface so that in an idle state it does not touch the conductive strips. Additionally the arrangement comprises an elastic keymat 802 with a key bulge 803 supported over the conductive dome, and an actuator 804 between the key bulge and the conductive dome for enhancing the tactile feel of the key when depressed. FIG. 8a represents the idle state where the key is not depressed, and FIG. 8b shows how pressing the key causes the conductive dome 801 to become into contact with the resistive strips 301 and 302. A mechanical support frame 805 supports the keymat and to some extent the whole arrangement.

From FIGS. 8a and 8b it is easy to deduce that although the invention allows for the keys to be placed into arbitrary locations over the available area of the keypad, there are certain limitations that apply at least to the most favourable embodiments of the invention. For enabling a reliable connection with every depression of a key it is advantageous if the vertical centerline of the conductive dome crosses through the middle point of the non-conductive zone that separates the resistive strips from each other. This way the possibilities for a reliable contact to each resistive strip are maximized. Additionally it is advantageous to arrange the mutual dimensioning of the resistive strips, the conductive dome and the actuator so that during a depression of a key, the size of the part of the conductive dome that actually presses against the surface of the dielectric board is large enough to cover a point from each resistive strip but simultaneously small enough so that it does not touch one or both of the resistive strips at multiple locations. With multiple locations we mean points on a resistive strip that are so far from each other that connecting them both to the other resistive strip would cause ambiguity in the resistance of the resulting current path. The connection between multiple locations may take place similarly with each depression of a certain key, but a far worse situation is the one where the nature of the connection varies from depression to depression due to e.g. the pressing force. The dimensioning of the different structural parts so that they obey these guidelines is within the capability of a person skilled in the art.

In order to avoid the ambiguity caused by a contact at multiple locations it is most advantageous to use such meandering types where two essentially different stretches of a resistive strip are always separated from each other by the other resistive strip running therebetween. An example of such a meandering type is seen in the upper right-hand corner of the dielectric board of FIG. 7a. This "intertwined spiral" arrangement of the resistive strips is most advantageously applied to such embodiments where it is not required to connect the distant ends of the strips to anywhere; see for example FIGS. 4a and 6a. However, by using conducting vias through the dielectric board it is possible to apply arbitrary meandering types to arbitrary coupling arrangements.

The risk for ambiguity caused by a contact at multiple locations is also reduced if one of the resistive strips is actually not resistive but a relatively good conductor. A contact from a single point of the resistive strip to multiple points of the conductive strip does not cause ambiguity, because the length of the conducting strip taking part in the created voltage divider does not have a significant effect on the measured voltage Vout.

Producing a resistive strip with a predetermined set of electric characteristics onto a dielectric board is a technique known as such. The methods that are applicable comprise but are not limited to photoetching, silk screen printing, polymer printing and the so-called Ohmega Plate technique.

Figure 9:
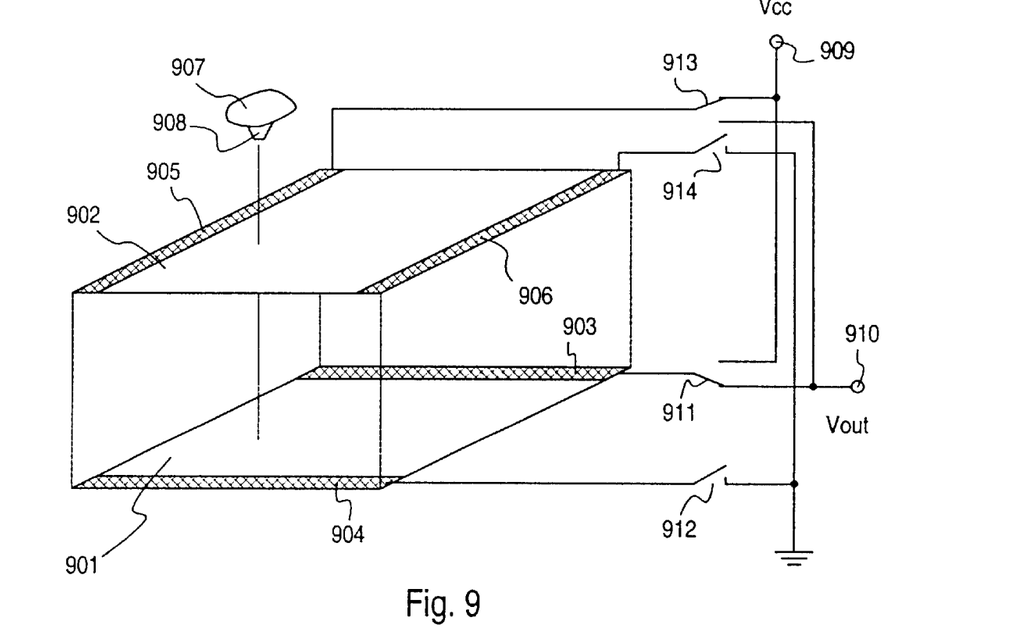
FIG. 9 illustrates a measurement concept according to another advantageous embodiment of the invention.

FIG. 9 is a partially exploded view of another keypad structure where an arrangement of essentially continuous conductive means is used to provide an unambiguous piece of information in response to the depression of a key. The core of the structure is the arrangement of a first resistive plane 901 and a second resistive plane 902 parallel to but separated from each other so that in an idle state they do not touch each other (in the exploded view the distance between the planes is naturally greatly exaggerated). Each of the resistive planes has a pair of conductive electrodes along two opposite sides so that the first resistive plane 901 has a "top" electrode 903 and a "bottom" electrode 904, and the second resistive plane 902 has a "left" electrode 905 and a "right" electrode 906. All terms that relate to certain directions are used for the sake of graphical clarity only and they do not have a limiting effect on the invention. A key 907 is also shown with an actuator 908 associated therein for enabling a very concentrated point-wise pressing action against the resistive planes when the key 907 is depressed.

The resistive planes may be continuous or consist of e.g. a resistive mesh on the surface of a dielectric plate. The structures that lie between the keys and the resistive planes are assumed to possess sufficient elasticity so that a depression of a key will create a point-like contact between the resistive planes.

It is not important to the invention that the resitive planes are rectangular; neither is it important that the electrodes of one resistive plane are at an exactly right angle against the electrodes of the other resistive plane. It is, however, important to this embodiment of the invention that the direction of the shortest distance between the electrodes of one resistive plane is different from the direction of the shortest distance between the electrodes of the other resistive plane.

FIG. 9 illustrates also a supply voltage port 909 and an output voltage port 910 as well as an arrangement of switches 911, 912, 913 and 914 arranged between the electrodes, the supply voltage port and the output voltage port. The first switch 911 has two positions for coupling the "top" electrode 903 either to the supply voltage port 909 or to the output voltage port 910, and the second switch 912 has an open position and a closed position in which it couples the "bottom" electrode 904 to a fixed (ground) potential. The third switch couples similarly the "left" electrode 905 either to the supply voltage port 909 or to the output voltage port 910, and the fourth switch is either open or couples the "right" electrode 906 to a fixed (ground) potential.

Figure 10:
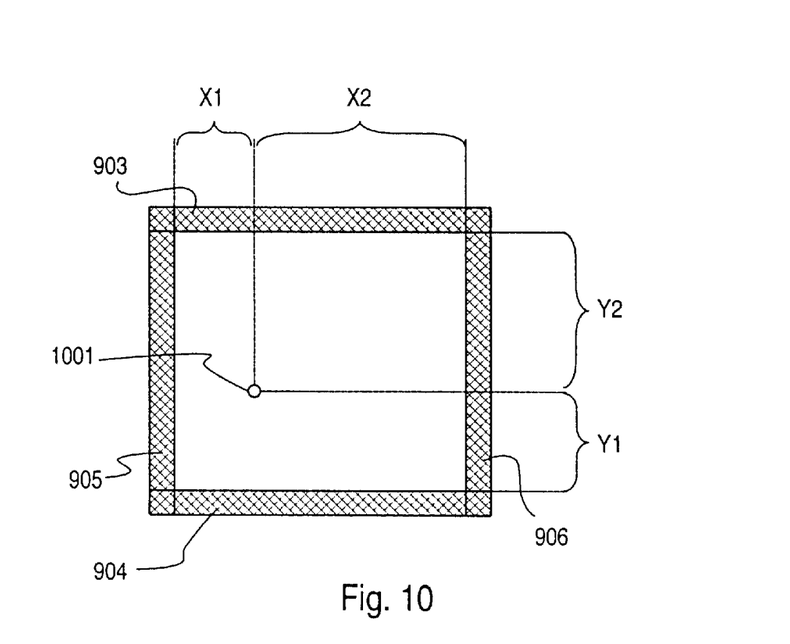
FIG. 10 illustrates the structure of FIG. 9 from a different direction.

FIG. 10 is a view of the arrangement of the two resistive planes from the direction of the key(s). The point at which a temporary electrical connection is created between the planes at the depression of a key is designated as 1001. The shortest distances from this point are X1 to the "left" electrode 905, X2 to the "right" electrode 906, Y1 to the "bottom" electrode 904 and Y2 to the "top" electrode 903. We may designate the resistances associated with these distances with R(X1), R(X2), R(Y1) and R(Y2) where R is some function the form of which is either known or experimentally obtainable. The function R may have a different form for the different resistive planes and it will also depend on the specific resistances of the plane material. For the sake of simplicity we leave the specific resistances out of the notation and assume that the function R has a universally valid form.

Figure 11A:
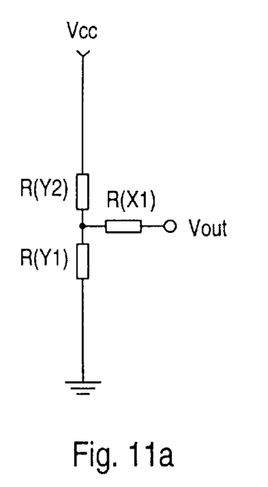
FIGS. 11a and 11b are equivalent circuit diagrams for FIG. 9.
Figure 11B:
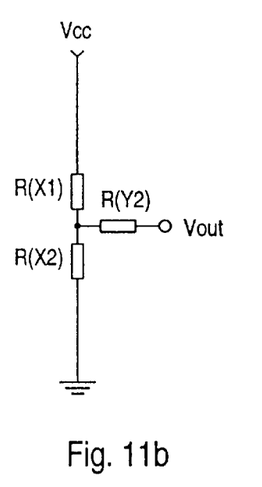

An advantageous way of using the arrangement of FIGS. 9 and 10 is as follows. Before a key is depressed, both grounding switches 912 and 914 are open. One of the other switches, e.g. switch 913, couples the corresponding electrode to the supply voltage Vcc and the other, e.g. switch 911, couples the corresponding electrode to the output voltage port. When a key is depressed, an electrical connection is created between the resistive planes. Assuming again that the output voltage port does not sink any current, such an electrical connection would produce a positive voltage signal with essentially the value Vcc to the output voltage port. When such a positive voltage signal is detected, a measurement cycle is started by closing the grounding switch (here: switch 914) which is associated with the same resistive plane as the switch that coupled the corresponding electrode to the supply voltage. The created circuit could then be modelled with the equivalent circuit diagram of FIG. 11a, and the voltage that can be sensed at the output voltage port will follow the expression $$Vout = \frac{R(X2)}{R(X1)+R(X2)} Vcc \quad (6)$$

which is unequivocally associated with a certain pair of distances X1 and X2. In other words, the sensed output voltage will indicate the X coordinate of the point of electrical connection. After the voltage has been sensed, the positions of all switches are reversed to produce a circuit which corresponds to the equivalent circuit diagram of FIG. 11b. The sensed output voltage is now $$Vout = \frac{R(Y1)}{R(Y1)+R(Y2)} Vcc \quad (7)$$

which is unequivocally associated with a certain pair of distances Y1 and Y2 and thus will indicate the Y coordinate of the point of electrical connection. After this voltage has been sensed, the measurement cycle has been completed and the arrangement will return to a state where it waits for a signal indicating the start of another measurement cycle. An A/D converter and a logical decoding circuit (not shown) are needed to interpret the pair of sensed values of the output voltage to a digital word indicating the depression of certain key.

Figure 12:
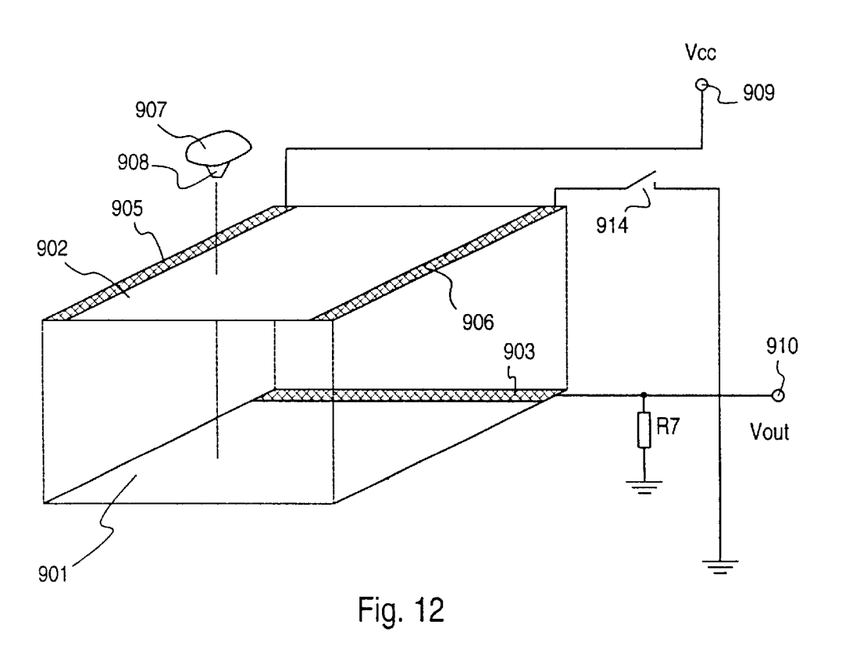
FIG. 12 illustrates a simplified version of FIG. 9.

FIG. 12 is a simplified version of the arrangement of FIG. 10. The "left" electrode 905 of the second resistive plane 902 has a fixed connection to the supply voltage Vcc, and the "top" electrode 903 of the first resistive plane 901 has a fixed connection to the output port Vout. Between the output port and the fixed (ground) potential there is a resistor R7. A switch 914 is provided for selectively coupling the "right" electrode 906 of the second resistive plane 902 to the fixed,(ground) potential. There is no "bottom" electrode at all in the first resistive plane 901.

Figure 13:
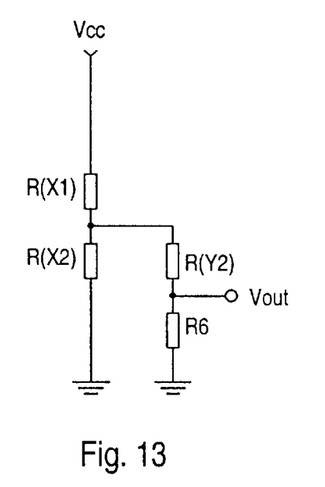
FIG. 13 is an equivalent circuit diagram of FIG. 12.

An advantageous way of using the arrangement of FIG. 12 is as follows. Before a key is depressed, the grounding switch 914 is open. When a key is depressed, an electrical connection is created between the resistive planes. Assuming again that the output voltage port does not sink any current, such an electrical connection would produce a positive voltage signal with essentially the value Vcc to the output voltage port. When such a positive voltage signal is detected, a measurement cycle is started by closing the grounding switch 914. The created circuit could then be modelled with the equivalent circuit diagram of FIG. 13, which resembles closely the circuit diagram of FIG. 5b. Not surprisingly also the value for the voltage Vout has a similar expression $$Vout = \frac{R(X2)(R7+R(Y2))}{(R7+R(X2)+R(Y2))R(X1)+R(X2)(R7+R(Y2))} Vcc \quad (8)$$

the value of which depends on all the distances X1, X2 and Y2. It is possible to select the resistivities of the resistive planes and the other structural parameters of the arrangement of FIG. 12 so that at least for a limited number of discrete key positions (corresponding to unique value sets for X1, X2 and Y2) there exists a set of corresponding unique values of the output voltage Vout. The selection of the structural parameters can be done by experimenting.

Figure 14:
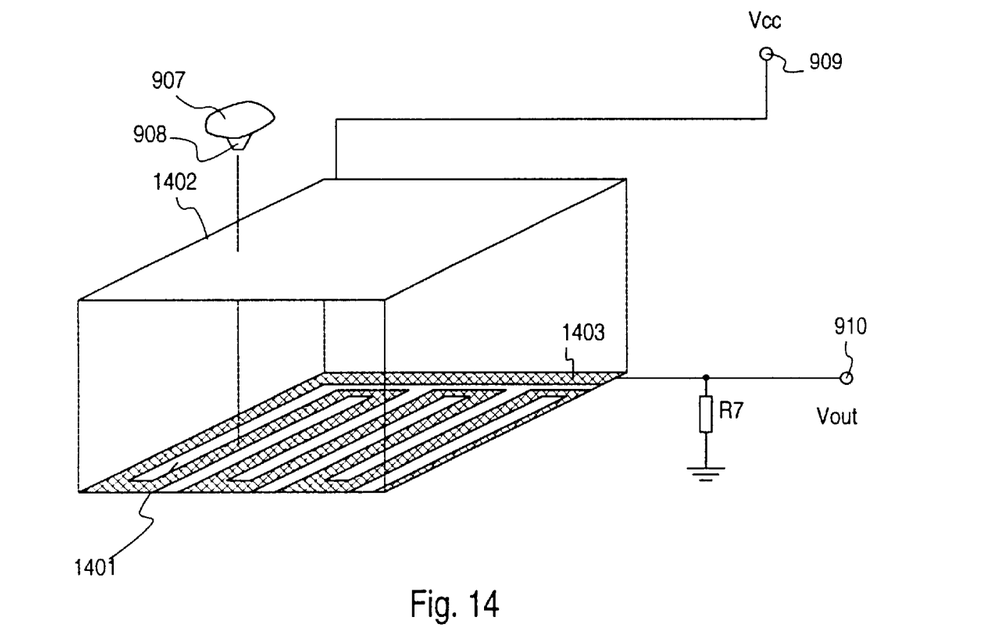
FIG. 14 illustrates a variation of the structure of FIG. 9

FIG. 14 illustrates a variation of the structure of FIGS. 9 and 12. It is actually a hybrid construction combining some features of the "elongated strip" embodiment of FIGS. 3a to 8b and the "resistive plane" embodiment of FIGS. 9 to 13. The arrangement comprises a dielectric plane 1401 and a conductive plane 1402. On the surface of the former there is a resistive, meandering elongated strip 1403 that covers substantially the whole dielectric plane. A key 907 is shown with an actuator 908 associated therein for enabling a concentrated pressing action against the planes when the key 907 is depressed. The actuator is dimensioned so that a depression of the key will cause a certain area of the conducting plane to press against the dielectric plane; the size of said area must be large enough so that each depression will hit at least partly the resistive strip, but small enough so that no depression will cause a contact to two or more different sections of the resistive strip.

In the embodiment of FIG. 14 a depression of a key will create a connection point between the conductive plate and the resistive strip. The result is a simple voltage divider circuit between the supply voltage Vcc and the fixed (ground) potential, in which voltage divider circuit the resistance closer to the supply voltage will equal the specific resistance of the elongated strip times the length along the strip from the connection point to the end of the strip which is connected to the output voltage port. The resistance closer to the fixed (ground) potential is the constant resistance R7. The value of the output voltage Vout will thus indicate unequivocally the location of the connection point along the length of the resistive strip.

All embodiments of FIGS. 9 to 14 can naturally be modified by changing the mutual order of the planar surfaces.

Figure 15:
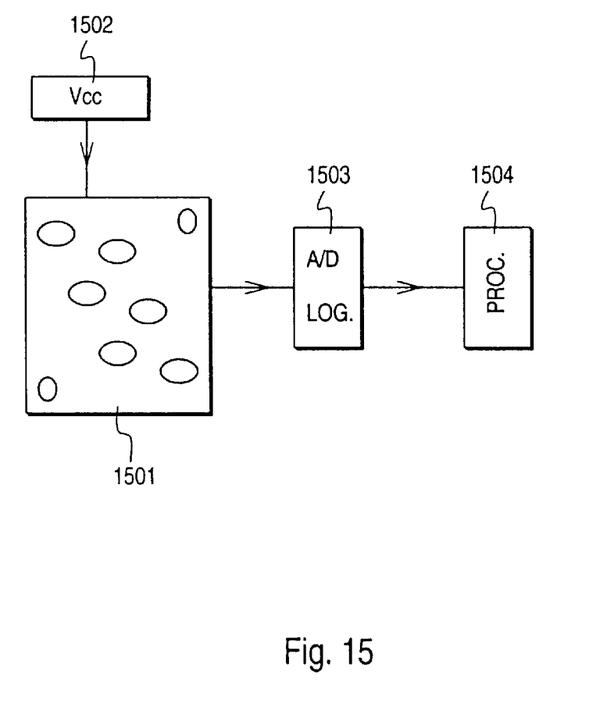
FIG. 15 is a schematic block diagram of an electronic device according to the invention.

FIG. 15 is a simplified block diagram illustrating the blocks of an electronic device that are important for providing input information to the device via a keypad. The arrangement comprises a keypad 1501, a supply voltage block 1502, an A/D converter and logical encoder block 1503 and a microprocessor 1504. The keypad 1501 may have any of the novel and inventive structures explained above. It may have an almost arbitrary number of keys at arbitrary locations. The supply voltage block 1502 provides a supply voltage to the keypad through a supply voltage port (not separately shown in FIG. 15). The A/D converter and logical encoder block 1503 is coupled to the output voltage port (not separately shown in FIG. 15) of the keypad for reading the output voltages associated with key depressions and for converting each key depression into a digital code word representing a specific key. It is the task of the designer of the electronic device to design the structure and operation of the A/D converter and logical encoder block 1503 so that when a user presses for example a key "1", the microprocessor 1504 will receive a code word that corresponds to the value 1.

As was pointed out previously, the invention allows the keys to be located at arbitrary locations of the keypad 1501. Due to statistical variation of parameters in a manufacturing process, it may happen that the resistive strips or other structures that are responsible for creating a certain output voltage in response to a certain key depression may have slightly different electrical characteristics from one manufactured device to another. Certain measures may be taken for reducing the risk of errors in input information that would result from such variation. One way is to arrange the A/D converter to apply such a coarse sampling grid that a small variation in the analogue voltage to be sampled does not alter the output of the A/D conversion. Another way which is especially suitable for application in association of the present invention is a so-called teaching step as a part of manufacturing and/or functional testing. The teaching step means simply that the A/D converter and logical encoder block 1503 is set into a learning mode, during which it has certain predetermined knowledge about which keys are going to be pressed and in which order. The testing arrangement will press each key several times, and the A/D converter and logical encoder block 1503 will store the mean value of the analogue voltage associated with each key. After the teaching step the A/D converter and logical encoder block 1503 is set to normal operation, during which it uses the stored values as a look-up table to which it compares each subsequent voltage associated with a depression of a key. By means of the look-up table it will determine, which key was pressed. Setting an A/D converter and logical encoder block into a learning mode and storing observed values or some values calculated from them into a look-up table is a process known as such to a person skilled in the art, as is the use of such a look-up table for the recognition of subsequent values.

It is advantageous to have a connection from the supply voltage Vcc to the A/D converter so that the value of the supply voltage acts as a reference voltage to the A/D conversion. This is an easy and advantageous way of making the operation of the keypad arrangement independent of any fluctuations in the value of the supply voltage.

Several modifications to the discussed embodiments are possible without departing from the scope of the invention as defined in the claims. For example, the invention does not require that the keypad is planar: it may have any three-dimensional form. It may even consist of several parts located at different parts of the electronic device. The keypad may also be a flexible device which the user can fold up for easy transportation and storing and open again for use. Such a foldable keypad is especially advantageous as a supplementary keypad for a small-sized portable electronic device, such as a mobile telephone. In such applications the blocks 1502, 1503 and 1504 of FIG. 15 may be within the electronic device and the keypad 1501 may be attached to the device through a connector and/or a cable. It is also possible to have within the keypad a voltage supply of its own and arrange the transfer of information from the keypad to the electronic device through a wireless link, such as an infrared link or a short-range radio connection.

What is claimed is:

1. A keypad arrangement for providing electrical information to an electronic device in response to a manual pressing action of a user, comprising:

a number of depressable keys within a certain keypad area;

an arrangement of essentially continuous conducting means next to the depressable keys, the arrangement comprising a first elongated strip with a first specific resistance and a second elongated strip with a parallel non-touching second specific resistance covering a planar surface adjacent to the depressable keys;

a connection creating means associated with each depressable key, the connection creating means comprising a conductive part associated with each key and supported in the vicinity of the first elongated strip and the second elongated strip so that a depression of a key is arranged to cause the corresponding conductive part to press against at least one part of said first elongated strip and said second elongated strip, the connection creating means providing, as a response to the depression of a key, an electrical connection through the essentially continuous conducting means so that the electrical characteristics of the created electrical connection uniquely identify the location of the depressed key in relation to the essentially continuous conducting means; and a supply voltage connection to said first enlongated strip and an output voltage connection from said second elongated strip.

2. A keypad arrangement according to claim 1, comprising a supply voltage connection to a first end of said first elongated strip, an open second end of said first elongated strip, a connection from a first end of said second elongated strip to an output voltage port and a grounding connection from said first end of said second elongated strip through a constant resistance.

3. A keypad arrangement according to claim 1, wherein said parallel non-touching set-up of a first elongated strip and a second elongated strip covers a certain planar surface by meandering back and forth over said planar surface in a certain direction.

4. A keypad arrangement according to claim 1, wherein said parallel non-touching set-up of a first elongated strip and a second elongated strip covers a certain planar surface by spiralling over said planar surface.

5. A keypad arrangement according to claim 1, wherein one of the first and second specific resistances is in the order of the specific resistance of well-conducting metals, and the other of the first and second specific resistances is considerably higher.

6. A keypad arrangement according to claim 1, wherein the first and second specific resistances are considerably higher than the specific resistance of well-conducting metals.

7. A keypad arrangement according to claim 1, wherein the parallel edges of said first elongated strip and a second elongated strip comprise a portion of intertwined projections.

8. A keypad arrangement according to claim 1, wherein said arrangement of essentially continuous conducting means consists of a conductive plane and an elongated strip with a certain specific resistance in a parallel non-touching arrangement next to the depressable keys, and said connection creating means consist of means for causing a local elastic deformation in said conductive plane to create a point-like connection between the conductive plane and a certain part of said elongated strip.

9. A keypad arrangement according to claim 1, wherein said arrangement of essentially continuous conducting means consists of a conductive plane and an elongated strip with a certain specific resistance in a parallel non-touching arrangement next to the depressable keys, and said connection creating means consist of means for causing a local elastic deformation in said elongated strip to create a point-like connection between the conductive plane and a certain part of said elongated strip.

10. A keypad arrangement according to claim 1, comprising
a supply voltage connection to a first end of said first elongated strip,
a grounding connection from a second end of said first elongated strip and
a connection from a first end of said second elongated strip to an output voltage port.

11. A keypad arrangement according to claim 10, further comprising a grounding connection from said first end of said second elongated strip through a constant resistance.

12. A keypad arrangement according to claim 1, wherein said arrangement of essentially continuous conducting means consists of a first resistive plane and a second resistive plane in a parallel non-touching arrangement next to the depressable keys, and said connection creating means consist of means for causing a local elastic deformation in at least one of the resistive planes to create a point-like connection between the resistive planes.

13. A keypad arrangement according to claim 12, wherein
said first resistive plane comprises two opposite side edges and a pair of conductive electrodes along said opposite side edges,
said second resistive plane comprises two opposite side edges and a pair of conductive electrodes along said opposite side edges so that the conductive electrodes along the side edges of the second resistive plane have a different direction than the conductive electrodes along the side edges of the first resistive plane,
a first selection switch is provided for selectively coupling a first conductive electrode of said first resistive plane either to a supply voltage port or to an output voltage port,
a first grounding switch is provided for selectively coupling a second conductive electrode of said first resistive plane to a fixed potential,
a second selection switch is provided for selectively coupling a first conductive electrode of said second resistive plane either to a supply voltage port or to an output voltage port and
a second grounding switch is provided for selectively coupling a second conductive electrode of said second resistive plane to a fixed potential.

14. A keypad arrangement according to claim 12, wherein said second resistive plane comprises two opposite side edges and a pair of conductive electrodes along said opposite side edges,
said first resistive plane comprises a side edge and a conductive electrode along said side edge so that the conductive electrode along the side edge of the first resistive plane has a different direction than the conductive electrodes along the side edges of the second resistive plane,
a coupling is provided between a first conductive electrode of said second resistive plane to a supply voltage port,
a grounding switch is provided for selectively coupling a second conductive electrode of said second resistive plane to a fixed potential,
a coupling is provided between said conductive electrode of said first resistive plane to an output voltage port and
a grounding connection is provided between said output voltage port and a fixed potential through a constant resistance.

15. An electronic device comprising:
a keypad for providing analogue electrical information to the electronic device in response to a manual pressing action of a user;
an analogue to digital converter for converting the provided analogue electrical information into digital form;
digital circuitry for acting upon the provided analogue electrical information converted into digital form; wherein
the keypad comprises an arrangement of essentially continuous conducting means comprising a first elongated strip with a first specific resistance and a parallel non-touching second elongated strip with a second specific resistance covering a planar surface next to the depressable keys, and a connection creating means comprising a conductive part associated with each depressable key and supported in the vicinity of the first elongated strip and the second elongated strip for providing, as a response to the depression of a key, an electrical connection through said essentially continuous conducting means so that the electrical characteristics of the created electrical connection uniquely identify the location of the depressed key in relation to said essentially continuous conducting means; and
the analogue to digital converter is arranged to identify the electrical characteristics of the created electrical connection and to provide digital information that uniquely identifies the depressed key to the digital circuitry.

16. A keypad for an electrical device comprising:
at least one depressable key adjacent a keypad;
at least a first resistive strip and a parallel second resistive strip on the keypad, wherein the first strip is connected to an electrical potential and the second strip provides an output voltage connection; and
an electrically conductive part on the key, the conductive part adapted to establish an electrical connection between the first strip and the second strip when the key is depressed, wherein electrical characteristics of the electrical connection uniquely identify a location of the key in relation to the first and the second strip.

17. A keypad of claim 16 wherein the first strip and the parallel second strip create, a meandering arrangement over a planar surface of the keypad.

18. The keypad of claim 16 wherein a specific resistance of the first strip and another specific resistance of the second strip is constant along each strip.

* * * * *

UNITED STATES PATENT AND TRADEMARK OFFICE
CERTIFICATE OF CORRECTION

PATENT NO. : 6,504,492 B1
DATED : January 7, 2003
INVENTOR(S) : Muurinen

It is certified that error appears in the above-identified patent and that said Letters Patent is hereby corrected as shown below:

<u>Title page,</u>
Item [30], Foreign Application Priority Data, date should be -- December 4, 1998 -- not "April 12, 1998".

Signed and Sealed this

Nineteenth Day of August, 2003

JAMES E. ROGAN
*Director of the United States Patent and Trademark Office*